(12) United States Patent
Baranchik et al.

(10) Patent No.: US 9,698,819 B1
(45) Date of Patent: Jul. 4, 2017

(54) HUFFMAN CODE GENERATION

(71) Applicant: AMAZON TECHNOLOGIES, INC., Seattle, WA (US)

(72) Inventors: Michael Baranchik, Natanya (IL); Ron Diamant, Albany, CA (US); Muhannad Ghanem, Hafia (IL); Ori Weber, Tel-Aviv (IL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/390,304

(22) Filed: Dec. 23, 2016

(51) Int. Cl.
*H03M 7/40* (2006.01)
*H03M 7/30* (2006.01)
*H03M 7/42* (2006.01)

(52) U.S. Cl.
CPC ............ *H03M 7/40* (2013.01); *H03M 7/30* (2013.01); *H03M 7/42* (2013.01); *H03M 7/6058* (2013.01)

(58) Field of Classification Search
CPC ............ H03M 7/40; H03M 7/30; H03M 7/42; H03M 7/6058
USPC .......................................... 341/65, 106, 107
See application file for complete search history.

(56) References Cited

U.S. PATENT DOCUMENTS

| 6,040,790 | A | * | 3/2000 | Law | H03M 7/405 341/65 |
| 7,358,870 | B2 | * | 4/2008 | Bay | H03M 7/42 341/65 |
| 8,279,095 | B2 | * | 10/2012 | Lee | H03M 7/40 341/65 |
| 9,542,427 | B2 | * | 1/2017 | Kataoka | H03M 7/405 |

* cited by examiner

*Primary Examiner* — Brian Young
(74) *Attorney, Agent, or Firm* — Conley Rose, P.C.

(57) ABSTRACT

A method for generating Huffman codewords to encode a dataset includes selecting a Huffman tree type from a plurality of different Huffman tree types. Each of the Huffman tree types specifies a different range of codeword length in a Huffman tree. A Huffman tree of the selected type is produced by: determining a number of nodes available to be allocated as leaves in each level of the Huffman tree accounting for allocation of leaves in each level of the Huffman tree; allocating nodes to be leaves such that the number of nodes allocated in a given level of the Huffman tree is constrained to be no more than the number of nodes available to be allocated in the given level; and assigning the leaves to symbols of the dataset based an assignment strategy selected from a plurality of assignment strategies to produce symbol codeword information.

20 Claims, 7 Drawing Sheets

HUFFMAN CODE GENERATION

BACKGROUND

Data compression is a process that transforms an input data set into a different data set that contains the same information as the input data set and is smaller in size than the input data set. Electronic systems apply data compression to reduce the amount of storage required to store a data set or the amount of time required to transmit a data set in considering compression performance, a compression ratio is defined as the ratio of the size of the input data set to the size of the compressed data set. The larger the compression ratio, the greater the savings in storage or time provided by the compression. By decreasing the required memory for data storage or the time required for data transmission, compression can provide an economic advantage. If physical devices such as semiconductor memory, magnetic disks, optical storage devices, or other storage technologies are utilized to store datasets, then a smaller space is required on the device for storing the compressed data thereby utilizing fewer devices. Similarly, if transmission media having limited bandwidth are utilized for transmitting a data set, then compressing data prior to transmission can result in an improvement in efficiency of utilization of the transmission media. Data compression can be particularly effective if the input data set contains redundancy, such as having symbols or strings of symbols that appear with high frequency.

BRIEF DESCRIPTION OF THE DRAWINGS

For a detailed description of various examples, reference will now be made to the accompanying drawings in which.

DETAILED DESCRIPTION

Figure 1:
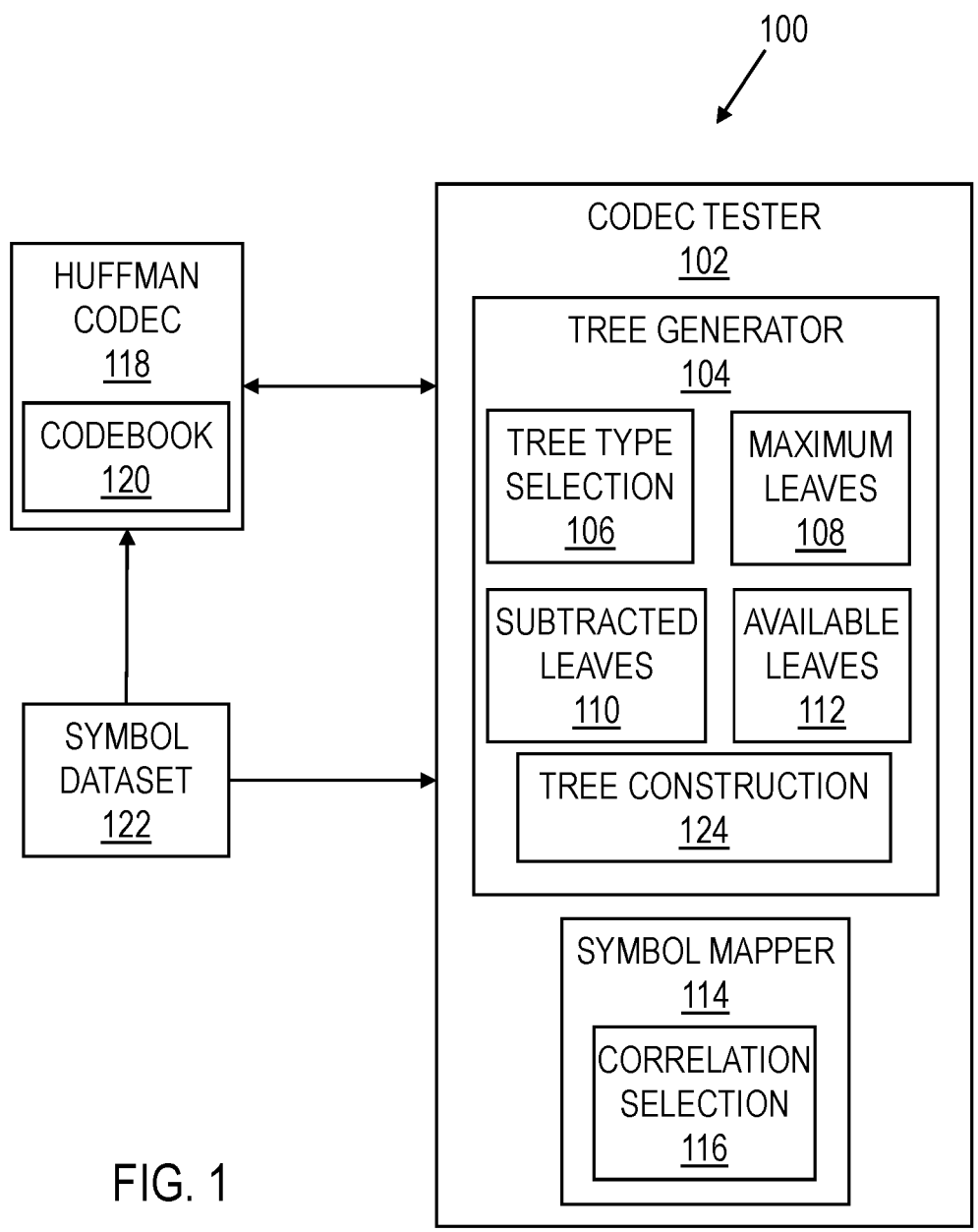
FIG. 1 shows a block diagram for a system for generating Huffman codes used to test a Huffman coder/decoder (codec) in accordance with various examples.

Huffman coding is a method of data compression in which symbols used most frequently in a dataset, where symbols can be characters, sets of characters, words, bytes, etc., are assigned codewords that are smaller in size (e.g., having fewer bits), than the codewords that are assigned to symbols less frequently used in the data set. For example, considering words in a document, a word that is more frequently used in the document may be assigned a codeword having fewer bits than a word that is less frequently used in the document. To generate a codebook for the document, the text of the document is analyzed to determine the frequency of occurrence of each word in the document. Based on results of the analysis, a codebook is constructed in which the most frequently used words are assigned the shortest codewords.

Because a Huffman codec may be called on to apply Huffman codes of variable efficiency, Huffman codec designs must be tested using a variety of Huffman codes. For example, a Huffman codec should be tested using Huffman codes that efficiently compress a dataset and Huffman codes that are less efficient at compressing the dataset. More generally, the Huffman codec should be tested using Huffman codes that range from common cases to extreme corner cases that are outside the typical operating conditions of the Huffman codec. Thus, in testing a Huffman codec, there is a need to randomize multiple Huffman trees (the trees from which Huffman codes are derived) to achieve different compression ratios. However, creation of a random Huffman tree for use in testing a Huffman codec can produce an unrealistic tree.

For example, for a tree having a maximum of N-levels (i.e., a maximum N-bit codeword length) the number of possible leaves in each level of the tree is $2^K$, where K is the level in the tree. Because a Huffman tree is a binary tree, each node in level k may spawn 2 nodes in the next higher level k+1. Assuming a portion of a data set to be compressed includes M symbols, the number of options to place M symbols in $2^K$ possible leaves in a level K can be very large. For example, if randomly choosing in which level of the tree to assign five leaves to symbols of a code, the total number of options is $(2^1-1)+(2^2-1)+(2^3-1)+ \ldots +(2^5)$. Randomly choosing five leaves in this range leads to a strong bias towards the deeper levels (levels with larger k), and in turn, longer codeword lengths. Thus, the probability of choosing a leaf out of level K is proportional to the numbers of leaves in that level, making it very unlikely that a well-balanced and natural tree is chosen, and naively randomizing a Huffman tree among the valid options will lead to unrealistic trees, which in turn leads to an inefficient compression scheme and unrealistic testing scenarios, which should be avoided.

Another issue in Huffman codec testing is the need to test all corner cases of different encoder/decoder configurations while testing a codec implementation. Testing the common case scenarios is insufficient, and the codec should be configured to apply unusual and extreme corner cases to verify that the codec operates properly under extreme conditions.

Thus, in generating Huffman trees for use in testing of a Huffman codec at least two problems arise: 1) validity; and 2) efficiency. Randomization can even lead to invalid trees. For example, if five symbols are to be assigned codewords, then a Huffman tree that is 3 levels deep can be employed. The total number of available leaves in the tree is 1+3+8=12, which is enough for the five codewords. Randomization may spread the leaves for symbols as follows: (1, 1, 3), that is: 1 leaf from the $1^{st}$ level, 1 leaf from the $2^{nd}$ level, and 3 leaves from the $3^{rd}$ level. Unfortunately, such a leaf selection leads to an invalid tree, as each node selected to be a leaf marks the end of its branch of the tree, and prevents further choice of leaves from that branch. In this example after the first 2 levels, in which one node was selected to be a leaf in each level, the tree is left with only two leaves in the third level, making selection of three leaves illegal. With regard to efficiency, freely randomizing Huffman trees can lead to unbalanced trees that produce very long codewords. Conventional solutions to these problems implement a bank of valid trees, and randomly select a tree from the bank for each test. While such a solution prevents invalid trees, this approach fails to present usage corners that can be achieved only by a random generation.

Embodiments of the present disclosure provide Huffman code generation that produces valid Huffman trees of a variety of dimensions and assigns symbols to leaves of the tree in a variety of distributions that allow testing of usage corners of a Huffman codec that are not generally encountered. To generate valid Huffman trees, embodiments build a Huffman tree and consider the effect that choosing a node to be a leaf has on the remainder of the tree. Each node, if chosen as a leaf, terminates a branch of the tree. That is, a node that becomes a leaf marks the end of the tree for that particular branch. Huffman trees are binary trees in which each level of the tree potentially includes $2^K$ nodes, where K enumerates a level of the tree. Each node has two possible child nodes in the next higher level, which in turn each has two children nodes in the next higher level and so on. Each node is the root of a binary sub-tree. Thus, each node chosen to be a leaf in level K, eliminates 2 nodes from level K+1, 4 nodes from K+2, 8 nodes from K+3 and so forth. To generate a valid Huffman tree, embodiments ensure that, given leaf assignments in lower levels of the tree, the higher levels of the tree provide sufficient leaves to support the number of symbols to be encoded. For example, given M symbols to be encoded, if L is the number of leaves assigned in levels<=K, embodiments ensure that the sum of all available leaves in levels K+1 . . . N (wherein N is the last level) is at least M-L after subtractions for leaf assignments in each level.

Embodiments maintain various data structures that constrain generation to valid Huffman trees. Embodiments may construct and maintain a MaximumLeaves structure, a SubtractedLeaves structure, and an AvailableLeaves structure that constrain generation of Huffman trees. The MaximumLeaves structure defines the maximum number of leaves that are available in each of level of the tree. The SubtractedLeaves structure is a matrix recording the number of nodes of the tree subtracted from each level due to leaf assignments in lower levels. The AvailableLeaves structure records the number of nodes available for assignment as leaves in each level of the tree. The number of leaves available in a level may be determined as the maximum number of leaves supported by a level less the total number of leaves not available in the level due leaf assignments in lower levels of the tree. Embodiments apply the information recorded in the MaximumLeaves, SubtractedLeaves, and AvailableLeaves structures to ensure valid tree generation by allocating no more leaves in a level than are available for allocation based on the information recorded in the AvailableLeaves structure. Embodiments also constrain the total number of leaves in a tree to equal the number of symbols to be encoded, and accordingly can create valid Huffman trees constrained to a predetermined number of levels and a predetermined number of symbols.

Embodiments categorize trees by length and width, and define a measurement (D) that is the difference in length between the longest codeword and the shortest codeword in the tree to facilitate the categorization. For example, three categories of trees that embodiments may generate to test a Huffman codec are: a balanced tree, a typical tree, and a sparse tree. In a balanced tree, leaf distribution is most balanced, in that D is minimal. In a balanced tree, D is constrained to be relatively small. For example, D may be less than a first predetermined range value (e.g., less than 5). In some embodiments of a balanced tree, D may be in a range {3, 4}. The balanced tree represents data that is not strongly biased towards a certain set of symbols, and can provide good compression performance on fairly uncompressible data. In a typical tree, D may be greater than the first predetermined range value and less than a second predetermined range value (e.g., 10≥D>5). In some embodiments of a typical tree, D may be in the range {7, 8}. The typical tree represents typically compressible data, which includes a relatively high number of recurring symbols and patterns. Typical trees may provide considerable compression rates, and are used to check performance with compressible data. In a sparse tree, D is relatively large. For example, D may be greater than the second range predetermined value (e.g., >10). In some embodiments of a sparse tree, D may be in the range {12, 13}. A sparse tree represents highly compressible data, such as a block of data with a relatively large number of zeros. Embodiments assign the shortest codewords possible to such data to provide the best possible compression. To achieve this, embodiments must include long codewords in the tree.

Embodiments generate a tree of a selected type (i.e., a balanced, typical, or sparse tree) and assign leaves of the tree to the symbols to be encoded. Embodiments map the leaves to symbols in a variety of ways to achieve usage corners that are not generally encountered by a Huffman codec. Having generated a specific tree, embodiments may assign symbols to leaves of the tree in, for example, a correlated manner, a reverse-correlated manner, or a non-correlated manner. In correlated assignment, shorter codewords are assigned to the highest probability symbols in the code. In reverse-correlated assignment, shorter codewords are assigned to the least probable symbols in the code. In this way, embodiments provide codes in which data is strongly reverse correlated to the tree, and can reach corners with very long codewords. In non-correlated assignment, the symbols are not correlated to the tree in any way, which may lead to corners of unexpected behavior. By mapping symbols to selected trees in these ways, embodiments can achieve usage corners that are not normally encountered by a Huffman codec to allow the operation of the codec to be tested in extreme conditions.

FIG. 1 shows a block diagram for a system 100 for generating Huffman codes used to test a Huffman codec in accordance with various examples. The system 100 includes a Huffman codec tester 102 and a Huffman codec 118. The Huffman codec 118 may be a hardware device that includes circuitry for Huffman encoding and decoding, or a processor (e.g., a microprocessor) executing programming (e.g., software instructions) that causes the processor to provide Huffman encoding/decoding. The Huffman codec 118 includes a codebook 120 that the codec 118 applies to compress and decompress a dataset. The codebook 120 associates symbols to be encoded with codewords that replace those symbols in a compressed dataset. The Huffman codec 118 is tested using a variety of codebooks 120 to exercise the codec 118 in ways that may occur infrequently in practice (i.e., corner cases).

The Huffman codec tester 102 generates the codebooks 120 applied by and used to test the Huffman codec 118. The codec tester 102 includes a tree generator 104 and a symbol mapper 114. The tree generator 104 constructs the Huffman trees from which the codebook 120 is derived. The symbol mapper 114 assigns symbols to the leaves of the Huffman trees produced by the tree generator 104. Validity and efficiency are two problems that arise in the generation of Huffman trees for use in testing the Huffman codec 118. While randomization in tree generation can produce trees that are useful for testing the codec 118 under extreme conditions, randomization can also produce invalid trees. Embodiments of the codec tester 102 avoid generation of invalid trees.

Figure 2:
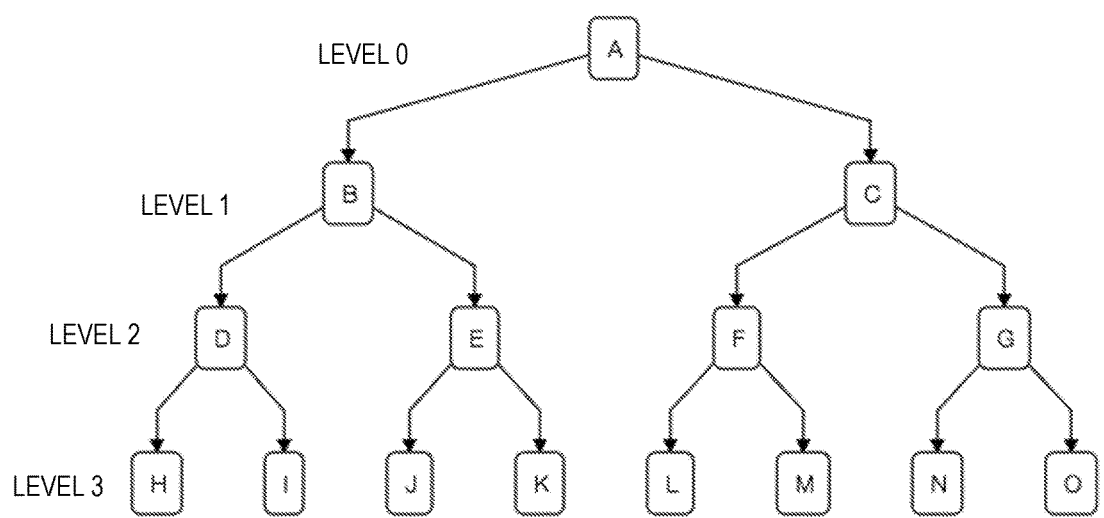
FIG. 2 shows an example of a Huffman tree in accordance with various examples.

Huffman trees are binary trees. FIG. 2 shows an example of a binary tree in accordance with various examples. Because a Huffman tree is a binary tree, each node may have two child nodes in the next higher level, which in turn each has two child nodes in the next higher level and so on. A node that has no child nodes is called a leaf. Each node, if chosen to be a leaf, terminates its branch of the tree. That is, a node selected to be a leaf, marks the end of the tree for the branch of the leaf. Each node may be considered the root of a binary sub-tree, which means that a node chosen be a leaf in level K, subtracts two nodes from level K+1, four nodes from level K+2, eight nodes from level K+3 and so forth. The codec tester 102 determines the effect that choosing a node of a tree to be a leaf has on the remainder of the tree. Thus, to provide L levels in the tree, that is, at least one leaf in level L−1, the tree generator 104 assures that the tree has at least one node that is not a leaf in every level up to level L−2. If $2^K$ is the number of nodes in level K, there are $(2^K-1)$ possible leaves in level K, excluding a node for tree continuation.

In the tree of FIG. 2, node A has 2 children, nodes B and C, and node B has two children, nodes D and E, and so forth. If node C is to be made a leaf, its children, F and G, will not exist, their children L, M, N, and O will not exist, etc. If a node becomes a leaf, the entire sub-tree emanating from the node degenerates to one object—the leaf. For a node chosen to be leaf in level K, the updated next levels available nodes number is $(2^{K+1}-2, 2^{K+2}-4, 2^{K+3}-8, \ldots, 2^N-2^{N-K})$.

The tree generator 104 applies constraints to tree construction that account for leaf assignments in lower levels of the tree and result in the generation of valid Huffman trees. The tree generator 104 includes tree type selection logic 106, tree construction logic 124, a maximum leaves structure, a subtracted leaves structure, and an available leaves structure. The tree type selection logic 106 selects any of a variety of types of Huffman trees to be generated for testing the Huffman codec 118. The tree type selection logic 106 may specify tree types by length and width, and define a measurement (D) that is the difference in length between the longest codeword and the shortest codeword in the tree to distinguish the different tree types. Some embodiments of the tree type selection logic 106 select from balanced, typical, and sparse tree types. The balanced tree type specifies a tree in which leaf distribution is most balanced, in that the D is minimal. To construct a balanced tree, the tree type selection logic 106 constrains D to be relatively small, typically in the range {3, 4}. The balanced tree represents data that is not strongly biased towards a certain set of symbols, and can provide good compression performance on fairly uncompressible data.

The typical tree type specifies a tree with D in the range {7, 8}. The typical tree represents typical compressible data, which includes a large number of recurring symbols and patterns. The typical tree type can achieve considerable compression rates, and is used to test the performance of the Huffman codec 118 with compressible data.

The sparse tree type specifies a tree in which D is relatively large, e.g., in the range {12, 13}. The sparse tree type represents a highly compressible data set, such as a block of data with a lot of zeros. For such highly redundant data sets, embodiments seek to provide a high degree of compression, and accordingly use codewords that are as short as possible to represent the most likely symbols. To provide the short codewords, the tree must also include long codewords.

The tree construction logic 124 builds a Huffman tree of the type selected by the tree type selection logic 106 for use in testing the Huffman codec 118. In some embodiments, the tree type selection logic 106 may specify trees of multiple types to provide a broad range of coverage for testing the Marian codec 118. The tree construction logic 124 ensures that the Huffman trees generated are valid by applying the maximum leaves structure 108, the subtracted leaves structure 110, and the available leaves structure 112 to constrain the parameters of the tree. The tree construction logic 106 builds and maintains each of the maximum leaves structure 108, the subtracted leaves structure 110, and the available leaves structure 112 during tree generation.

The maximum leaves structure 108 may be provided as an array that defines the maximum absolute leaves that are available in each of N levels of the tree. For example, an embodiment of the maximum leaves structure 108 may be constructed as:

$$[2^1-1, 2^2-1, 2^3-1, \ldots, 2^N-1]$$

The subtracted leaves structure 110 may be provided as a two-dimensional matrix that records a number of nodes of the tree that are subtracted from each level m, due to a choice in a lower level. Given that, in the subtracted leaves structure 110, [m] is row number, and [n] is column number: SubtractedLeaves(m, n)=number of nodes removed from level m by creating leaves in lower level n. $L_m$ is the number of leaves chosen in level M. An example of the subtracted leaves structure 110 is shown in Table 1 below.

TABLE 1

| m | n | | | |
|---|---|---|---|---|
| | 1 | 2 | 3 | 4 |
| 1 | 0 | 0 | 0 | 0 |
| 2 | $2L_1$ | 0 | 0 | 0 |
| 3 | $4L_1$ | $2L_2$ | 0 | 0 |
| 4 | $8L_1$ | $4L_2$ | $2L_3$ | 0 |

In the subtracted leaves structure 110, a choice in a given level n affects only subsequent levels, so SubtractedLeaves (n≥m)=0. For each level lower level of the tree, the number of nodes is multiplied by 2, accordingly:

$$\text{SubtractedLeaves}(m>n)=2^{m-n} \cdot L_n.$$

This, in Table 1, two nodes are subtracted from level two due a leaf assignment in level one, six nodes are subtracted from level three due to leaf assignments in levels one and two, and 14 nodes are subtracted from level four due to leaf assignments in levels one, two, and three.

The available leaves structure 112 may be provided as an array of length N (the total number of levels of the tree) that defines the number of available leaves in each level of the tree. An entry K in the available leaves structure 112 may be defined as:

$$\text{AvailableLeaves}[K]=\text{MaximumLeaves}[K]-\text{SumOf-Row}(\text{SubtractedLeaves}[k])$$

That is, the number of available leaves in a level of the tree is the maximum possible number of leaves in the level of the tree less the total amount of leaves removed from the level due to leaf assignments in all lower levels.

For each level K of the tree being built, the tree construction logic 124 assigns a number of nodes between 0 and AvailableLeaves[K] to become leaves. Thus, the tree construction logic 124 constrains the number of leaves in each level to be valid according the assignments made in lower levels. For each level K, the tree construction logic 124 assigns the number of leaves in the level (NumOfLeavesIn-Level) as:

(NumOfLeavesInLevel[$k$]≥0) AND (NumOfLeavesInLevel[$k$]≤AvailableLeaves[$k$])

The tree construction logic 124 further constrains the total number of leaves in the tree to be M, the number of symbols in the code (i.e., the total number of different symbols to be encoded):

NumOfLeavesInLevel[0]+ . . . +NumOfLeavesInLevel[$N$-1]==M

In this way, the tree construction logic 124 assures the creation of a valid Huffman Tree with at most N levels and M symbols.

The symbol mapper 114 assigns the symbols of the dataset 122 to the leaves of the tree built by the tree construction logic 124. The symbol mapper 114 may assign symbols of the dataset 122 to the leaves based on any of a number of different symbol to leaf assignment strategies. Embodiments of the symbol mapper 114 may employ assignment strategies that apply various degrees of correlation between symbol probability and codeword length to assign the symbols to the leaves. For example, symbols may be assigned to the leaves using a correlated strategy based on correlation between symbol probability and codeword length, a reverse correlated strategy based on reverse correlation between symbol probability and codeword length, and/or a non-correlated strategy based on no correlation between symbol probability and codeword length.

If symbol probability is correlated with codeword length, then shorter codewords are assigned to the highest probability symbols in the dataset 122, as would typically be found in Huffman coding. If symbol probability is reverse correlated with codeword length, then shorter codewords are assigned to the least probable symbols in the dataset 122 (the antithesis of what is typically found in Huffman coding). Symbol assignment using reverse correlation allows the codec tester 102 to provide a codebook 120 in which data is strongly reverse correlated to the dataset 122, and thereby reach corners having an abundance of very long codewords. If symbol probability is not correlated with codeword length, then there is no relationship between codeword length and the probabilities of the symbols in the dataset 122, which may also lead to corners of unexpected behavior in the Huffman codec 118.

Figure 3:
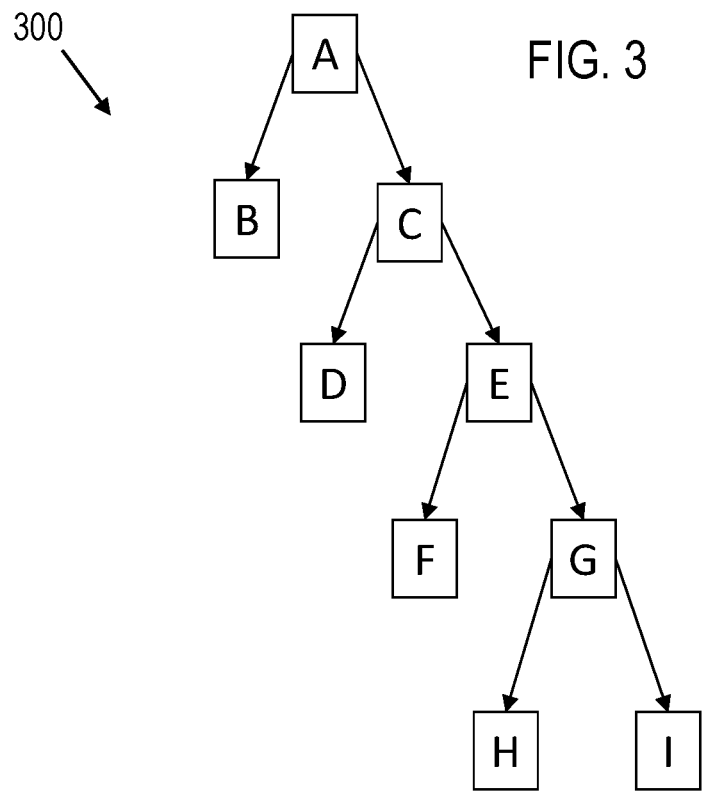
FIG. 3 shows an example of construction of a Huffman tree in accordance with various examples.

FIG. 3 shows a first example of construction of a Huffman tree 300 in accordance with various examples. In FIG. 3, the tree generator 104 is building a tree to encode a five symbol dataset. In practice the tree generator 104 may construct a tree for a dataset including any number of symbols. In the tree 300, the tree generator 104 maximizes the difference (D) in length between the longest and shortest codewords in the tree by constructing a long and narrow tree. For a dataset of five symbols, the tree 300 represents the greatest possible D, and accordingly the tree 300 may be referred to as a sparse tree with respect to the five symbol dataset. The Table 2 below represents the subtracted leaves structure 110 applied by the tree generator 104 to build the tree 300. Table 2 shows that selection of node B as a leaf removes two nodes from level two, removes four nodes from level three, and removes eight nodes from level four. Selection of node D as a leaf removes two nodes from level three and removes four nodes from level four. Selection of node F as a leaf removes two nodes from level four. The tree construction logic 124 applies the information stored in the subtracted leaves structure 110 (as represented in Table 2), and the information stored in the maximum leaves structure 108 to generate the available leaves structure 112 and determine the number of leaves available in each level of the tree 300 as described above.

TABLE 2

| | n | | | |
|---|---|---|---|---|
| m | 1 | 2 | 3 | 4 |
| 1 | 0 | 0 | 0 | 0 |
| 2 | 2 | 0 | 0 | 0 |
| 3 | 4$_1$ | 2 | 0 | 0 |
| 4 | 8 | 4 | 2 | 0 |

Figure 4:
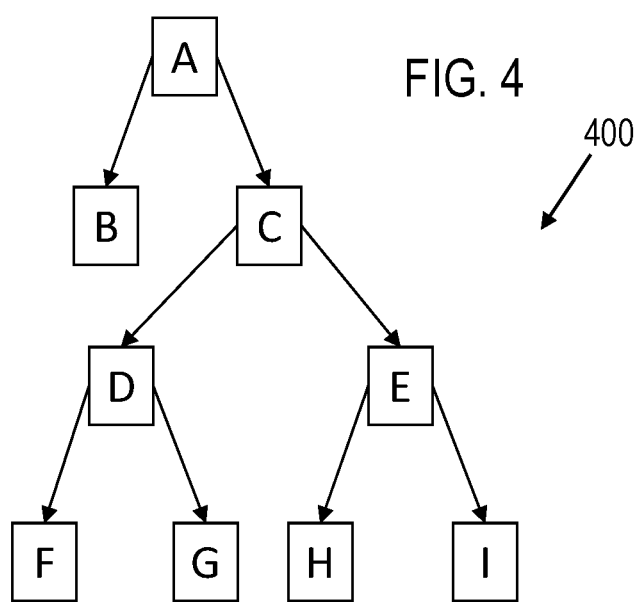
FIG. 4 shows an example of construction of a Huffman tree in accordance with various embodiments.

FIG. 4 shows a second example of construction of a Huffman tree 400 in accordance with various examples. In FIG. 4, the tree generator 104 is building a tree to encode a five symbol dataset. In practice the tree generator 104 may construct a tree for a dataset including any number of symbols. In the tree 400, the tree generator 104 constructs a tree that is broader and shallower than the tree 300 of FIG. 3. Accordingly, D is smaller for the tree 400 than the tree 300. The Table 3 below represents the subtracted leaves structure 110 applied by the tree generator 104 to build the tree 400. Table 3 shows that selection of node B as a leaf removes two nodes from level two, removes four nodes from level three, and removes eight nodes from level four. The tree construction logic 124 applies the information stored in the subtracted leaves structure 110 (as represented in Table 3), and the information stored in the maximum leaves structure 108 to generate the available leaves structure 112 and determine the number of leaves available in each level of the tree 400 as described above.

TABLE 3

| | n | | | |
|---|---|---|---|---|
| m | 1 | 2 | 3 | 4 |
| 1 | 0 | 0 | 0 | 0 |
| 2 | 2 | 0 | 0 | 0 |
| 3 | 4 | 0 | 0 | 0 |
| 4 | 8 | 0 | 0 | 0 |

Figure 5:
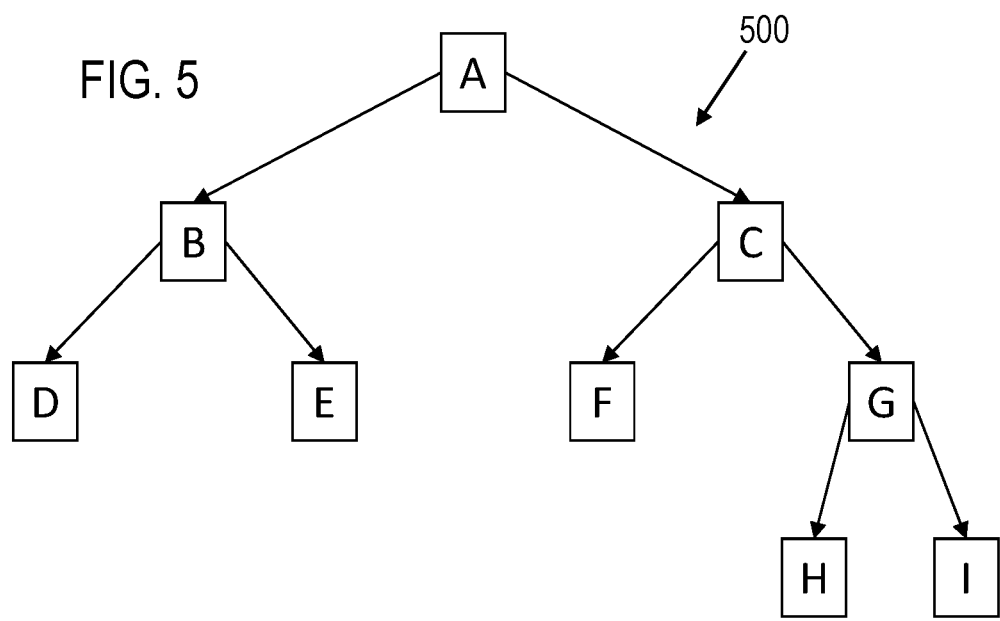
FIG. 5 shows an example of construction of a Huffman tree in accordance with various embodiments.

FIG. 5 shows a third example of construction of a Huffman tree 400 in accordance with various examples. In FIG. 5, the tree generator 104 is building a tree to encode a five symbol dataset. In practice the tree generator 104 may construct a tree for a dataset including any number of symbols. In the tree 500, the tree generator 104 constructs a tree that is broader and shallower than the tree 300 of FIG. 3 or the tree 400 of FIG. 4. Accordingly, D is smaller for the tree 500 than the tree 300 and the tree 400. The Table 4 below represents the subtracted leaves structure 110 applied by the tree generator 104 to build the tree 400. Table 4 shows that selection of nodes D, E, and F as leaves removes six nodes from level 3. The tree construction logic 124 applies the information stored in the subtracted leaves structure 110 (as represented in Table 4), and the information stored in the maximum leaves structure 108 to generate the available leaves structure 112 and determine the number of leaves available in each level of the tree 500 as described above.

TABLE 4

| m | n 1 | 2 | 3 | 4 |
|---|---|---|---|---|
| 1 | 0 | 0 | 0 | 0 |
| 2 | 0 | 0 | 0 | 0 |
| 3 | 0 | 6 | 0 | 0 |

Figure 6:
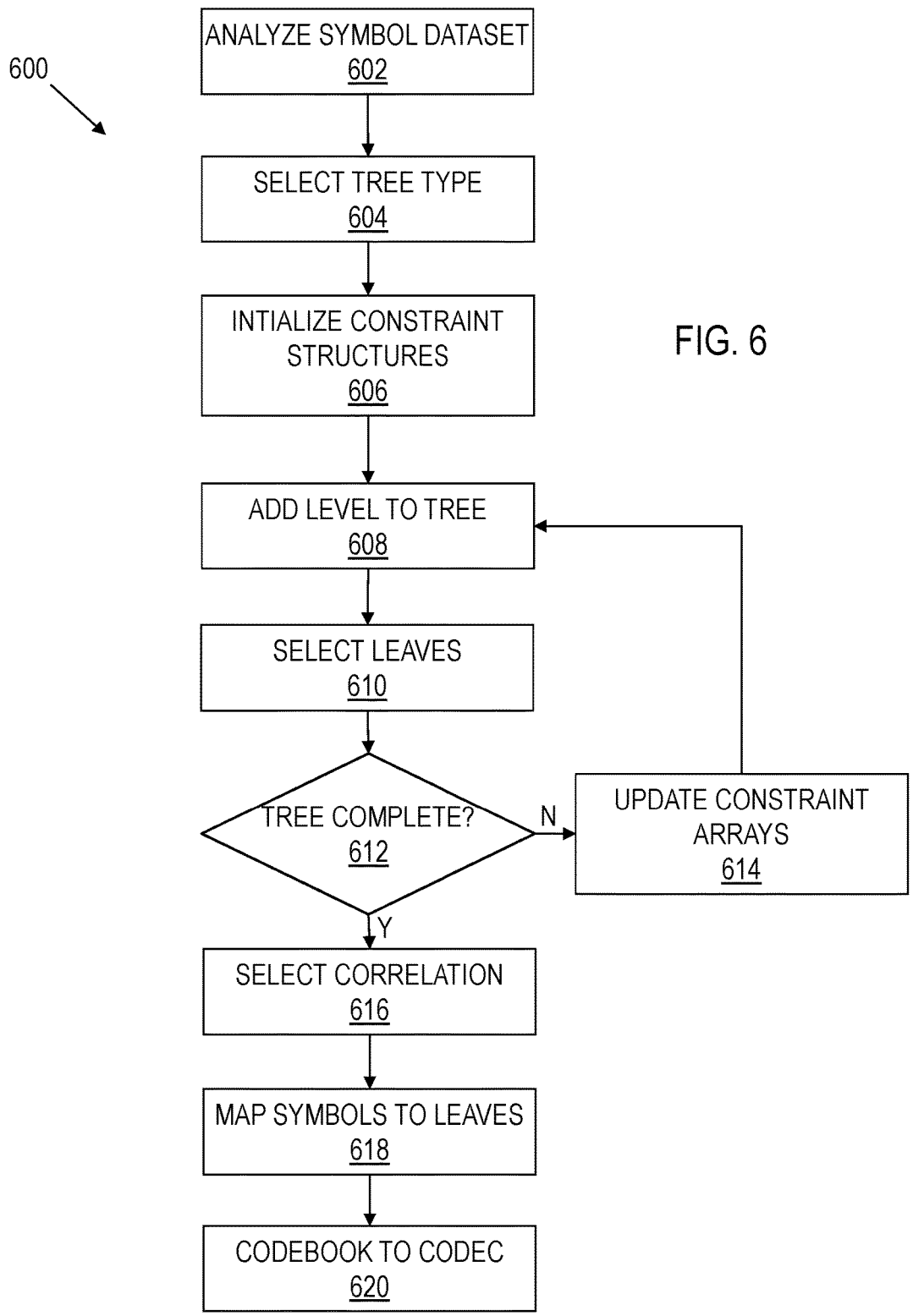
FIGS. 6 and 7 show flow diagrams for methods for building a Huffman code used for testing a Huffman codec in accordance with various examples.

FIG. 6 shows a flow diagram for a method 600 for building a Huffman code used for testing a Huffman codec in accordance with various examples. Though depicted sequentially as a matter of convenience, at least some of the actions shown can be performed in a different order and/or performed in parallel. Additionally, some embodiments may perform only some of the actions shown. The Huffman tree generation method 600 allows for generation of a wide variety of trees for use in generation of Huffman codes applicable to testing of a Huffman codec. The dimensions of the trees generated may varied to provide a range of trees suitable for testing the Huffman codec 118 under conditions not generally encountered. The method 600 constrains tree generation to generation of valid Huffman trees.

In block 602, the codec tester 102 analyzes the symbol dataset 122. The analysis may include identifying each symbol in the symbol dataset 122 and determining a probability value or a number of occurrences of each symbol in the symbol dataset 122. Thus, the codec tester 102 identifies the symbols to be represented in a Huffman codebook 120 provided to test the Huffman codec 118, and may identify probability values and/or probability distributions used to select tree types and symbol assignment strategies.

In block 604, the codec tester 102 selects a type of tree to be generated, where a Huffman code is to be derived from the generated tree. In some embodiments, the codec tester 102 may select any of a variety of different types of trees to be generated for testing the Huffman codec 118. Some embodiments of the codec tester 102 may specify tree types by length and width, and define a measurement (D) that is the difference in length between the longest codeword and the shortest codeword in the tree to distinguish the different tree types. For example, embodiments of the codec tester 102 may select from balanced, typical, and sparse tree types. The balanced tree type specifies a tree in which leaf distribution is most balanced, in that the D is minimal. To construct a balanced tree, the tree type selection logic 106 constrains D to be relatively small, for example, in the range {3, 4}. The balanced tree represents data that is not strongly biased towards a certain set of symbols, and can provide good compression performance on fairly uncompressible data.

The typical tree type specifies a tree with D, for example, in the range {7, 8}. The typical tree represents typical compressible data, which includes a large number of recurring symbols and patterns. The typical tree type can achieve considerable compression rates, and is used to test the performance of the Huffman codec 118 with compressible data.

The sparse tree type specifies a tree in which D is relatively large, e.g., in the range {12, 13}. The sparse tree type represents a highly compressible data set, such as a block of data with a lot of zeros. For such highly redundant data sets, at least some embodiments of the codec tester 102 seek to provide a high degree of compression, and accordingly use codewords that are as short as possible to represent the most likely symbols. To provide the short codewords, the tree must also include long codewords.

The codec tester 102 may select a tree type based on the analysis of the symbol dataset 122. For example, a sparse tree type may be selected for use with a highly compressible dataset. The codec tester 102 may select any tree type for use with any symbol dataset to test the Huffman codec 118 under atypical conditions. For example, the codec tester 102 may selected a balanced tree for use with highly compressible data to test the codec 118 under unusual conditions.

In block 606, the codec tester 102 initializes the constraint data structures, i.e., the maximum leaves structure 108, the subtracted leaves structure 110, and the available leaves structure. Initialization of the maximum leaves structure 108 may include allocating storage of predetermined size, computing the maximum number of nodes at level of a binary tree and recording the maximum number of nodes at each level in the allocated storage in a sequence representative of the levels of the tree. Initialization of the subtracted leaves structure 110 may include allocation of storage for a two-dimensional array having a number of rows and columns sufficient to represent a Huffman tree of a predetermined length, and writing initial values to the array (e.g., zeroing the array). Initialization of the available leaves structure 112 may include allocating storage of predetermined size, computing the maximum number of nodes at a level of a binary tree and recording the maximum number of nodes at each level in the allocated storage in a sequence representative of the levels of the levels of the tree.

In block 608, tree construction begins by adding a level to the tree. For example, referring to FIG. 3, level 1 is added to the tree by adding nodes B and C as children of node A.

In block 610, leaves are selected from the nodes added in block 608. For example, referring again to FIG. 3, node B may be selected to be a leaf. Selection of nodes to be leaves is constrained to the number of available nodes in a level as recorded in the available leaves structure 112. For example, no more than the number of available leaves in level 1, as recorded in the available leaves structure 112, may be allocated. If the number of symbols to be associated with leaves is greater than the number of available leaves in the level, then the codec tester 102 allocates fewer than all the available leaves in the level to allow for construction of higher levels of the tree (i.e., to produce additional nodes for allocation as leaves). The value of D may also be considered when allocating leaves. For example, a larger value of D may trigger assignment of leaves at lower levels to increase the length of the tree. Similarly, a smaller value of D may inhibit assignment of leaves at lower levels to produce more leaves in a higher level.

In block 612, the codec tester 102 determines whether tree construction is complete. For example, tree construction may be complete if all symbols identified in block 602 have been assigned to leaves of the tree. If tree construction is not complete, then, in block 614, the codec tester 102 updates the constraint arrays to reflect leaves assigned in block 610. For example, referring to Table 2, after assignment of node B to be a leaf, the subtracted leaves structure 110 may be updated so that selection of node B as a leaf removes two nodes from level two, removes four nodes from level three, and removes eight nodes from level four. Similarly, the available leaves structure 112 may be updated to show that two leaves are available in level two, four leaves are available in level three, etc. After the constraint arrays have been updated, tree construction continues in block 608.

If tree construction is deemed complete in block 612, then, in block 616, the codec tester 102 selects a symbol to leaf correlation strategy to apply for assignment of symbols to the leaves of the tree. For example, symbols may assigned to the leaves based on correlation between symbol probability and codeword length, reverse correlation between symbol probability and codeword length, and/or no correlation between symbol probability and codeword length. If symbol probability is correlated with codeword length, then shorter codewords are assigned to the highest probability symbols in the dataset 122, as would be typically found in Huffman coding. If symbol probability is reverse correlated with codeword length, then shorter codewords are assigned to the least probable symbols in the dataset 122. Symbol assignment using reverse correlation allows the codec tester 102 to provide a codebook 120 in which data is strongly reverse correlated to the dataset 122, and thereby reach corners having an abundance of very long codewords. If symbol probability is not correlated with codeword length, then there is no relationship between codeword length and the probabilities of the symbols in the dataset 122, which may lead to corners of unexpected behavior in the Huffman codec 118. To produce atypical codebooks for use in testing the Huffman codec 118, the codec tester 102 may select reverse correlation or no correlation of symbols. To produce more conventional codebooks for use in testing the Huffman codec 118, the codec tester 102 may assign symbols the leaves based correlation between symbol probability and codeword length.

In block 618, the codec tester 102 assigns the symbols of the symbol dataset 122 to the leaves of the tree. The assignment of symbols to leaves may be in accordance with the symbol to codeword correlation strategy selected in block 616.

In block 620, the codec tester 102 provides the codebook 120 to the Huffman codec 118 for use in verifying the operation of the Huffman codec 118. The codebook 120 associates each symbol of the symbol dataset 122 with a codeword value derived from the position of a leaf in the tree generated in blocks 604-614. The Huffman codec 118 may apply the codebook 120 to encode and decode the symbol dataset 122. The results of the encoding and/or decoding may be transmitted to the codec tester 102 for verification.

Figure 7:
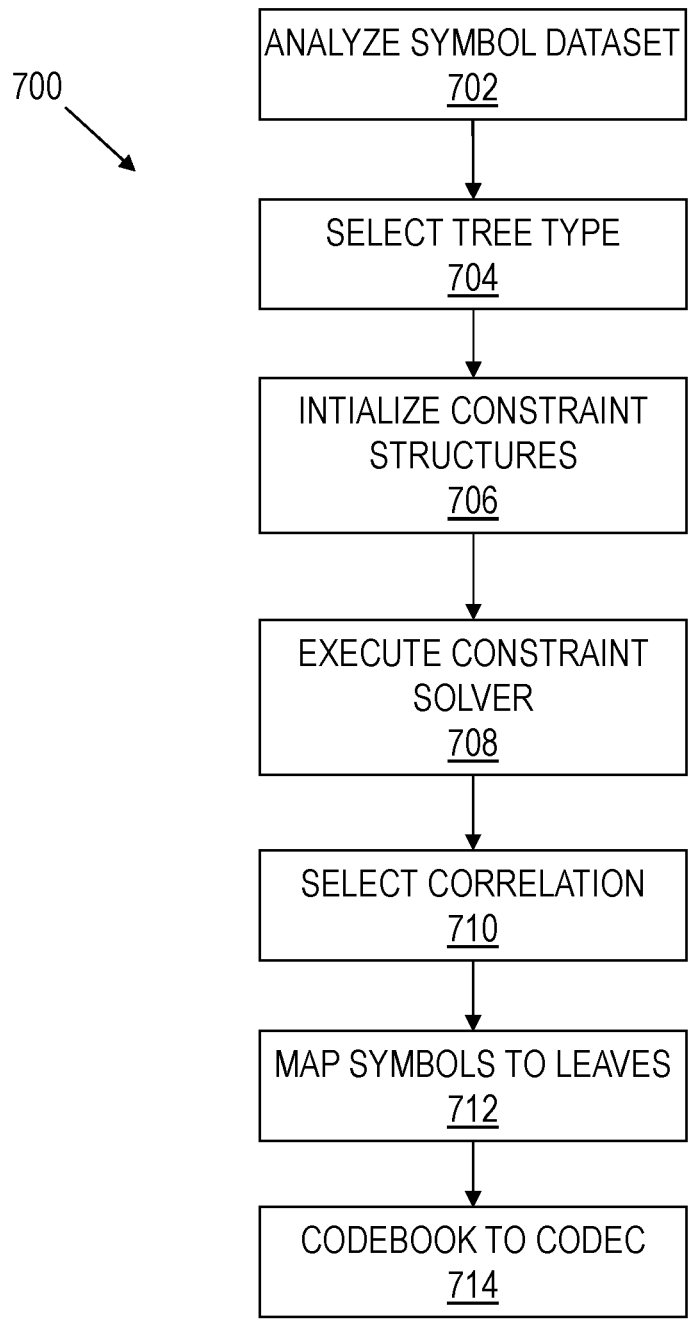

In some embodiments, the operations of blocks 608-614 may be performed in a constraint solver that applies the constraint structures initialized in block 606 to produce a tree that satisfies the various constraints recorded in the constraint structures. FIG. 7 shows a method 700 that applies a constraint solver to generate valid Huffman tree. Though depicted sequentially as a matter of convenience, at least some of the actions shown can be performed in a different order and/or performed in parallel. Additionally, some embodiments may perform only some of the actions shown. The Huffman tree generation method 700 allows for generation of a wide variety of trees for use in generation of Huffman codes applicable to testing of a Huffman codec. The dimensions of the trees generated may varied to provide a range of trees suitable for testing the Huffman codec 118 under conditions not generally encountered. The method 700 constrains tree generation to generation of valid Huffman trees.

In block 702, the codec tester 102 analyzes the symbol dataset 122. The analysis may include identifying each symbol in the symbol dataset 122 and determining a probability value or a number of occurrences of each symbol in the symbol dataset 122. Thus, the codec tester 102 identifies the symbols to be represented in a Huffman codebook 120 provided to test the Huffman codec 118, and may identify a probability values and/or probability distributions used to select tree types and symbol assignment strategies.

In block 704, the codec tester 102 selects a type of tree to be generated, where a Huffman code is to be derived from the generated tree. In some embodiments, the codec tester 102 may select any of a variety of different types of trees to be generated for testing the Huffman codec 118. Some embodiments of the codec tester 102 may specify tree types by length and width, and define a measurement (D) that is the difference in length between the longest codeword and the shortest codeword in the tree to distinguish the different tree types. For example, embodiments of the codec tester 102 may select from balanced, typical, and sparse tree types.

The codec tester 102 may select a tree type based on the analysis of the symbol dataset 122. For example, a sparse tree type may be selected for use with a highly compressible dataset. The codec tester 102 may select any tree type for use with any symbol dataset to test the Huffman codec 118 under atypical conditions. For example, the codec tester 102 may selected a balanced tree for use with highly compressible data to test the codec 118 under unusual conditions.

In block 706, the codec tester 102 initializes the constraint data structures, i.e., the maximum leaves structure 108, the subtracted leaves structure 110, and the available leaves structure. Initialization of the maximum leaves structure 108 may include allocating storage of predetermined size, computing the maximum number of nodes at level of a binary tree and recording the maximum number of nodes at each level in the allocated storage in a sequence representative of the levels of the tree. Initialization of the subtracted leaves structure 110 may include allocation of storage for a two-dimensional array having a number of rows and columns sufficient to represent a Huffman tree of a predetermined length, and writing initial values to the array (e.g., zeroing the array). Initialization of the available leaves structure 112 may include allocating storage of predetermined size, computing the maximum number of nodes at level of a binary tree and recording the maximum number of nodes at each level in the allocated storage in a sequence representative of the levels of the levels of the tree.

In block 708, the initialized constraint structures, along with additional information needed to produce a Huffman tree are provided to constraint solver. The additional information may include the total number of leaves the tree is to have (i.e., the total number of symbols to be encoded), a D value or tree type, etc. The constraint solver applies the constraint structures to produce a valid Huffman tree. In some embodiments, the constraint solver may produce multiple valid Huffman trees based on the constraint structures.

In block 710, the codec tester 102 selects a symbol to leaf correlation strategy to apply for assignment of symbols to the leaves of the tree. For example, symbols may assigned to the leaves based on correlation between symbol probability and codeword length, reverse correlation between symbol probability and codeword length, and/or no correlation between symbol probability and codeword length.

In block 712, the codec tester 102 assigns the symbols of the symbol dataset 122 to the leaves of the tree. The assignment of symbols to leaves may be in accordance with the symbol to codeword correlation strategy selected in block 710.

In block 620, the codec tester 102 provides the codebook 120 to the Huffman codec 118 for use in verifying the operation of the Huffman codec 118. The codebook 120 associates each symbol of the symbol dataset 122 with a codeword value derived from the position of a leaf in the tree generated in blocks 604-614. The Huffman codec 118 may apply the codebook 120 to encode and decode the symbol dataset 122. The results of the encoding and/or decoding may be transmitted to the codec tester 102 for verification.

Figure 8:
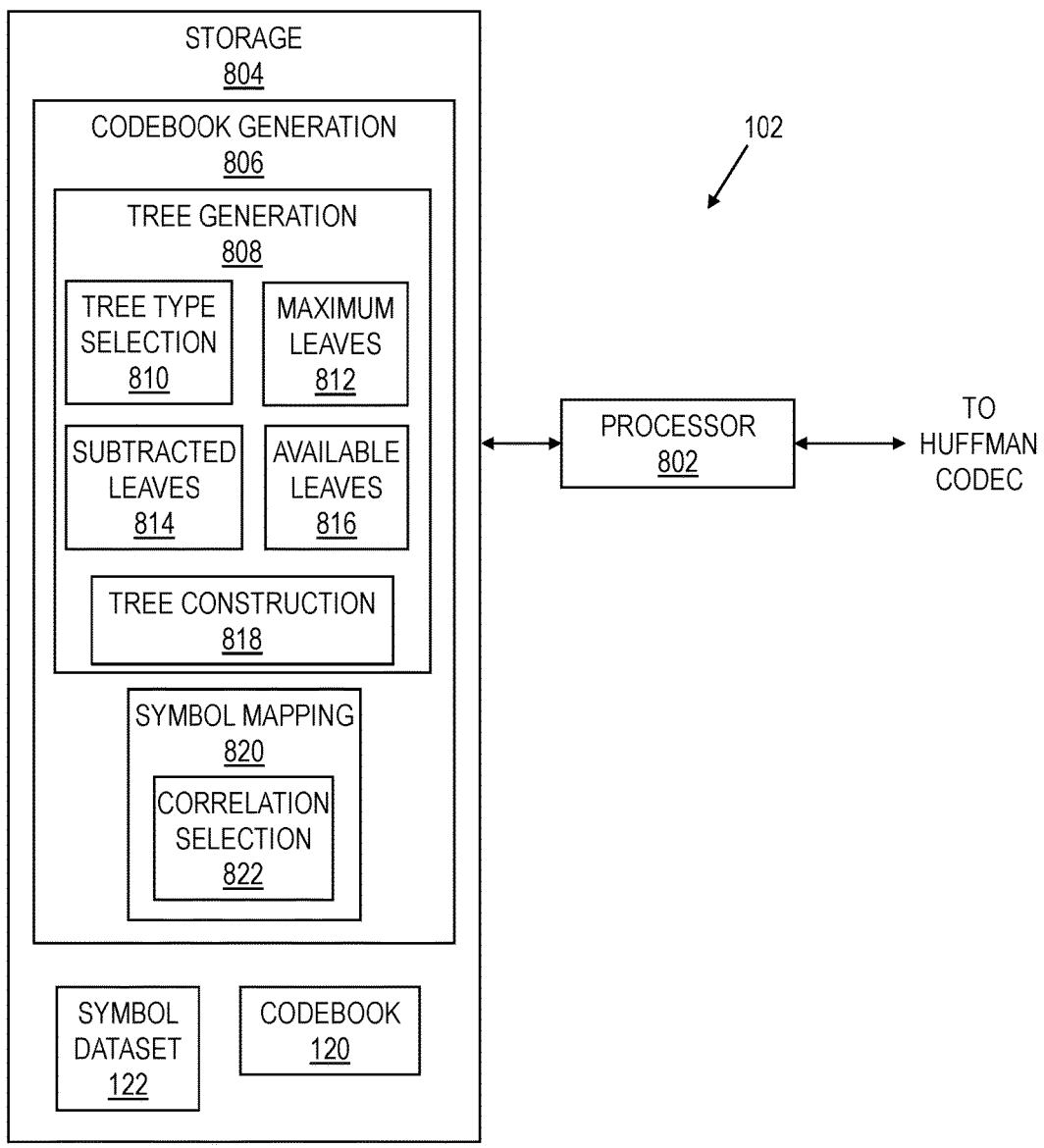
FIG. 8 shows a block diagram for a system for generating Huffman codes used for testing a Huffman codec in accordance with various examples.

FIG. 8 shows a block diagram for an embodiment of the codec tester 102. The illustrated embodiment of the codec tester 102 includes a processor 802 and storage 804. The processor 802 is an instruction execution circuit, and in various embodiments, may include one or more general-purpose or embedded microprocessors, micro-controllers, network processors, digital signal processors, and/or other instruction execution machines. The storage 804 may be coupled to the processor 802 via a local communication structure, such as a bus, or via a network, such as a wired or wireless communication network.

The storage 804 is a non-transitory, computer-readable storage medium configured to store program instructions and/or data accessible by processor 802. The storage 804 may be implemented using any suitable memory technology, such as static random access memory (SRAM), synchronous dynamic RAM (SDRAM), nonvolatile/Flash-type memory, optical or magnetic storage media, or any other type of memory. Program instructions (i.e., software programming) and data for implementing the functionality disclosed herein are stored within the storage 804. The storage 804 includes codebook generation instructions 802 that are executable by the processor 802 to generate Huffman codebooks for testing the Huffman codec 118. The codebook generation instructions 806 include tree generation instructions 808 and symbol mapping instructions 820.

The tree generation instructions 808 are executable by the processor 802 to build Huffman trees for use in producing the Huffman codes used to test the Huffman codec 118. The tree generation instructions 808 include tree: type selection instructions 810 and tree construction instructions 818. The tree type selection instructions 810 choose a type of tree to be built by the tree construction instructions 818. For example, the tree type selection instructions may choose a balanced tree type, a typical tree type, or a sparse tree type as disclosed herein to be the type of tree built by the tree construction instructions 818. The tree type selection instructions 810 may select any of the disclosed tree types as needed to test the operation of the Huffman codec 118 under a variety of operational conditions.

The tree construction instructions 818 can build a Huffman tree of any of the tree types disclosed herein. The tree construction instructions 818 ensure that each tree built is valid by constraining tree construction using the maximum leaves structure 812, the subtracted leaves structure 814, and the available leaves structure 816 that are built and maintained by the tree construction instructions 818, and stored in the storage 804. The maximum leaves structure 812, the subtracted leaves structure 814, and the available leaves structure 816 are embodiments of the maximum leaves structure 108, the subtracted leaves structure 110, and the available leaves structure 112 described herein.

The symbol mapping instructions 820 assign symbols of the symbol dataset 122 to the leaves of a tree built by the tree construction instructions 818. The symbol mapping instructions 820 assign symbols to the leaves based on correlation between symbol probability and codeword length, reverse correlation between symbol probability and codeword length, and/or no correlation between symbol probability and codeword length. If symbol probability is correlated with codeword length, then shorter codewords are assigned to the highest probability symbols in the symbol dataset 122, as would be typically found in Huffman coding. If symbol probability is reverse correlated with codeword length, then shorter codewords are assigned to the least probable symbols in the symbol dataset 122. Symbol assignment using reverse correlation allows for generation of a codebook 120 in which data is strongly reverse correlated to the symbol dataset 122, and thereby reach corners having an abundance of very long codewords. If symbol probability is not correlated with codeword length, then there is no relationship between codeword length and the probabilities of the symbols in the dataset 122, which may lead to corners of unexpected behavior in the Huffman codec 118.

Some embodiments of the codec tester 102, including the processor 802 and the storage 804, may be implemented in a computer as known in the art, such as a desktop computer, a notebook computer, a rack-mount computer, a server computer, or any other computing device whether physical or virtual. Various components of such a computing device have been omitted from FIG. 8 to promote clarity. For example, the codec tester 102 may include a network interface and/or input/output device.

A network interface may be configured to allow data to be exchanged between processor 802 and other devices coupled to a network (such as other computer systems, communication devices, input/output devices, or external storage devices). The network interface may support communication via wired or wireless data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

Input/output devices may include one or more display terminals, keyboards, keypads, touchpads, scanning devices, voice or optical recognition devices, or any other devices suitable for entering or retrieving data by the processor 802. In some embodiments, similar input/output devices may be separate from codec tester 102 and may interact with the codec tester 102 through a wired or wireless connection, such as over a network interface.

Those skilled in the art will also appreciate that in some embodiments the functionality disclosed herein may be provided in alternative ways, such as being split among more software modules or routines or consolidated into fewer modules or routines. Similarly, in some embodiments illustrated methods may provide more or less functionality than is described, such as when other illustrated methods instead lack or include such functionality respectively, or when the amount of functionality that is provided is altered. In addition, while various operations fray be illustrated as being performed in a particular manner (e.g., in serial or in parallel) and/or in a particular order, those skilled in the art will appreciate that in other embodiments the operations may be performed in other orders and in other manners. The various methods as depicted in the figures and described herein represent illustrative embodiments of methods. The methods may be implemented in software, in hardware, or in a combination thereof in various embodiments. Similarly, the order of any method may be changed, and various elements may be added, reordered, combined, omitted, modified, etc., in various embodiments.

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The recitation "based on" is intended to mean "based at least in part on." Therefore, if X is based on Y, X may be a function of Y and any number of other factors.

A "symbol" is an uncompressed data unit. A symbol may be represented by eight bits, sixteen bits, or any other number of bits fixed or variable. For example, in a text document, the words or letters of the document may constitute symbols.

A "codeword" is a compressed data unit. Each codeword can be represented by a different number of bits, e.g., in Huffman coding.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for testing a Huffman coder, comprising:
generating, by a computer, codewords to encode symbols of a dataset, wherein the generating comprises:
  selecting a Huffman tree type from a plurality of different Huffman tree types comprising:
    a balanced type in which the range of codeword length is no more than 5;
    a typical type in which the range of codeword length is greater than 5 and no more than 10;
    a sparse type in which the range of codeword length is greater than 10;
  building a Huffman tree of the selected Huffman tree type, wherein the building comprises:
    determining a number of nodes available to be allocated as leaves at each level of the Huffman tree accounting for allocation of leaves at each level of the Huffman tree;
    assigning nodes to be leaves such that no more than the number of nodes available to be allocated is allocated in any level of the Huffman tree, wherein the allocating comprises:
      constraining a number of leaves allocated in a given level of the Huffman tree to no more than the number of leaves available for allocation in the level; and
      constraining a total number of leaves in the Huffman tree to no more than a number of symbols in the dataset;
  selecting a symbol to leaf assignment strategy from a plurality of different symbol to leaf assignment strategies, each of the symbol to leaf assignment strategies providing a different correlation of symbol probability to codeword length; and
  assigning the leaves to symbols of the dataset based on the selected symbol to leaf assignment strategy;
providing, by the computer, symbol codeword information to the Huffman coder; and
encoding, by the Huffman coder, the dataset using the symbol codeword information.

2. The method of claim 1, wherein the building further comprises:
generating a first data structure in the memory, wherein each element of the first data structure specifies a maximum number of potential leaves provided in a level of the Huffman tree;
generating a second data structure in memory, wherein each element of the second data structure specifies a number of leaves not available in a given level of the Huffman tree due to allocation of a leaf at a higher level; and
generating a third data structure in memory, wherein each element of the third data structure specifies a number of leaves available for allocation in the given level of the Huffman tree based on information contained in the first data structure and the second data structure;
wherein constraining the number of leaves allocated in the given level comprises allocating, in the given level, no more than the number of leaves specified in the third data structure as available in the given level.

3. The method of claim 1, wherein the plurality of assignment strategies comprise:
a correlated strategy in which leaves are assigned to symbols such that higher symbol probabilities correspond to shorter codeword lengths;
a reverse correlated strategy in which leaves are assigned to symbols such that higher symbol probabilities correspond to longer codeword lengths; and
a non-correlated strategy in which leaves are assigned to symbols such that there is no correspondence of symbol probability to codeword length.

4. A system, comprising:
a Huffman coder configured to encode a dataset using codewords derived from a Huffman tree;
a computer;
a memory encoded with instructions that are executable by the computer to:
  generate the codewords to encode the dataset, wherein to generate the codewords the instructions cause the computer to:
    select a Huffman tree type from a plurality of different Huffman tree types, each of the Huffman tree types specifying a different range of codeword length provided by a Huffman tree;
    generate a Huffman tree of the selected Huffman tree type, wherein
      generating the Huffman tree comprises:
        determining a number of nodes available to be allocated as leaves at each level of the Huffman tree accounting for allocation of leaves at each level of the Huffman tree;
        allocating nodes to be leaves such that no more than the number of nodes available to be allocated is allocated in any level of the Huffman tree;
    select a symbol to leaf assignment strategy from a plurality of different symbol to leaf assignment strategies each providing a different correlation of symbol probability to codeword length; and
    assign the leaves to symbols of the dataset based on the selected symbol to leaf assignment strategy; and
  provide symbol codeword information to the Huffman coder for use in encoding the dataset.

5. The system of claim 4 wherein the instructions are further executable by the computer to:

generate a first data structure in the memory, wherein each element of the first data structure specifies a maximum number of potential leaves provided in a level of the Huffman tree;

generate a second data structure in memory, wherein each element of the second data structure specifies a number of leaves not available in a given level of the Huffman tree due to allocation of a leaf at a lower level; and generate a third data structure in memory, wherein each element of the third data structure specifies a number of leaves available for allocation at a level of the Huffman tree based on information contained in the first data structure and the second data structure.

6. The system of claim 5, wherein the instructions are further executable by the computer to constrain the number of leaves allocated in a level of the Huffman tree to no more than the number of leaves available for allocation in the level specified in the third data structure.

7. The system of claim 5, wherein the instructions are further executable by the computer to generate the second data structure as a two dimensional matrix, wherein each row of the matrix and each column of the matrix corresponds to a level of the Huffman tree.

8. The system of claim 4, wherein the instructions are further executable by the computer to constrain a total number of leaves in the Huffman tree to no more than a total number of different symbols in the dataset.

9. The system of claim 4, wherein the instructions are further executable by the computer to determine a range of codeword length as a difference in length of a longest and shortest codeword derived from the Huffman tree.

10. The system of claim 4, wherein the Huffman tree types comprise:
a balanced type in which the range of codeword length is no more than a first predetermined value;
a typical type in which the range of codeword length is greater than the first predetermined value and no more than a second predetermined value; and
a sparse type in which the range of codeword length is greater than the second predetermined value.

11. The system of claim 4, wherein the symbol to leaf assignment strategies comprise:
a correlated strategy in which leaves are assigned to symbols such that higher symbol probabilities correspond to shorter codeword lengths;
a reverse correlated strategy in which leaves are assigned to symbols such that higher symbol probabilities correspond to longer codeword lengths; and
a non-correlated strategy in which leaves are assigned to symbols such that there is no correspondence of symbol probability to codeword length.

12. The system of claim 4, wherein the instructions are executable by the computer to, for a given level of the Huffman tree, provide at least as many leaves in levels of the Huffman tree higher than the given level as there are symbols that are unassigned to leaves in the given level and levels lower than the given level.

13. A method, comprising:
generating Huffman codewords to encode a dataset, wherein the generating comprises:
selecting a Huffman tree type from a plurality of different Huffman tree types, each of the Huffman tree types specifying a different range of codeword length provided by a Huffman tree;
producing a Huffman tree of the selected Huffman tree type, wherein the producing comprises:
determining a number of nodes available to be allocated as leaves in each level of the Huffman tree accounting for allocation of leaves in each level of the Huffman tree;
allocating nodes to be leaves such that the number of nodes allocated in a given level of the Huffman tree is constrained to be no more than the number of nodes available to be allocated in the given level; and
assigning the leaves to symbols of the dataset based on an assignment strategy selected from a plurality of assignment strategies to produce symbol codeword information;
providing the symbol codeword information to a Huffman coder; and
encoding, by the Huffman coder, the dataset using the symbol codeword information.

14. The method of claim 13, further comprising, for a given level of the Huffman tree, providing at least as many leaves in levels of the Huffman tree higher than the given level as there are symbols that are unassigned to leaves in the given level and levels lower than the given level.

15. The method of claim 13, wherein the plurality of assignment strategies comprise:
a correlated strategy in which leaves are assigned to symbols such that higher symbol probabilities correspond to shorter codeword lengths;
a reverse correlated strategy in which leaves are assigned to symbols such that higher symbol probabilities correspond to longer codeword lengths; and
a non-correlated strategy in which leaves are assigned to symbols such that there is no correspondence of symbol probability to codeword length.

16. The method of claim 13, wherein the producing comprises:
generating a first data structure in the memory, wherein each element of the first data structure specifies a maximum number of potential leaves provided in a level of the Huffman tree;
generating a second data structure in memory, wherein each element of the second data structure specifies a number of leaves not available in a given level and column of the Huffman tree due to allocation of a leaf at a lower level; and
generating a third data structure in memory, wherein each element of the third data structure specifies a number of leaves available for allocation in a level of the Huffman tree based on information contained in the first data structure and the second data structure.

17. The method of claim 16, wherein the producing comprises constraining the number of leaves allocated in the given level of the Huffman tree to no more than the number of leaves available for allocation in the given level specified in the third data structure.

18. The method of claim 13, wherein the producing comprises constraining a total number of leaves in the Huffman tree to no more than a number of symbols in the dataset.

19. The method of claim 13, further comprising determining the range of codeword length as a difference in length of a longest and shortest codeword derived from the Huffman tree.

20. The method of claim 13, wherein the Huffman tree types comprise:
a balanced type in which the range of codeword length is no more than a first predetermined value;

a typical type in which the range of codeword length is greater than the first predetermined value and no more than a second predetermined value; and a sparse type in which the range of codeword length is greater than the second predetermined value.

* * * * *